US009509306B2

(12) United States Patent
Ostertun et al.

(10) Patent No.: US 9,509,306 B2
(45) Date of Patent: Nov. 29, 2016

(54) TAMPER RESISTANT IC

(71) Applicant: NXP B.V., Eindhoven (NL)

(72) Inventors: Soenke Ostertun, Wedel (DE); Michael Ziesmann, Hamburg (DE)

(73) Assignee: NXP B.V., Eindhoven (NL)

(*) Notice: Subject to any disclaimer, the term of this patent is extended or adjusted under 35 U.S.C. 154(b) by 621 days.

(21) Appl. No.: 13/866,864

(22) Filed: Apr. 19, 2013

(65) Prior Publication Data

US 2013/0307578 A1 Nov. 21, 2013

(30) Foreign Application Priority Data

May 15, 2012 (EP) .................................... 12168100

(51) Int. Cl.
H03K 19/003 (2006.01)
H01L 23/00 (2006.01)
H01L 21/306 (2006.01)

(52) U.S. Cl.
CPC .......... *H03K 19/003* (2013.01); *H01L 21/306* (2013.01); *H01L 23/576* (2013.01); *H01L 2924/0002* (2013.01)

(58) Field of Classification Search
CPC ............... H01L 2924/00; H01L 2224/48465; H01L 2224/48247; H01L 23/576; H01L 23/544; H01L 23/57; H01L 22/34; H01L 21/306; H01L 2924/002; H04L 9/3278; G06F 2221/2153; G06F 21/72; G06F 2221/2129; G06F 21/44; H03K 19/003; H03K 19/17768

USPC ............ 326/8–9, 15; 257/48, 639, 758, 773, 257/E21.008, E23.141

See application file for complete search history.

(56) References Cited

U.S. PATENT DOCUMENTS

| 6,047,068 | A | 4/2000 | Rhelimi et al. |
| 7,309,907 | B2 | 12/2007 | De Jongh et al. |
| 7,838,873 | B2 | 11/2010 | Clevenger et al. |
| 2001/0033012 | A1* | 10/2001 | Kommerling et al. ....... 257/679 |
| 2008/0054427 | A1* | 3/2008 | Usami et al. ................. 257/679 |
| 2010/0032776 | A1* | 2/2010 | Pham et al. ................... 257/417 |
| 2010/0155620 | A1* | 6/2010 | Hutchison et al. ...... 250/440.11 |

FOREIGN PATENT DOCUMENTS

| FR | 2 848 025 | 11/2002 |
| WO | 98/18102 A1 | 4/1998 |
| WO | 03/061004 A2 | 7/2003 |

OTHER PUBLICATIONS

Sreedhar, A. et al. "Physically Unclonable Functions for Embedded Security based on Lithographic Variation", IEEE Design, Automation & Test in Europe Conference & Exhibition, 6 pgs (Mar. 2011).
Extended European Search Report for Patent Appln. No. 12168100.1 (Oct. 16, 2012).

* cited by examiner

Primary Examiner — Don Le

(57) ABSTRACT

According to an aspect of the invention an integrated circuit is conceived which comprises a physical unclonable function which is at least partially implemented in a passivation layer of said integrated circuit. According to a further aspect of the invention, a corresponding method for manufacturing an integrated circuit is conceived. According to a further aspect of the invention, an electronic device is conceived which comprises an integrated circuit of the kind set forth.

6 Claims, 2 Drawing Sheets

TAMPER RESISTANT IC

CROSS-REFERENCE TO RELATED APPLICATIONS

This application claims the priority under 35 U.S.C. §119 of European patent application no. 12168100.1, filed on May 15, 2012, the contents of which are incorporated by reference herein.

FIELD OF THE INVENTION

The invention relates to an integrated circuit. The invention also relates to a method for manufacturing an integrated circuit and to an electronic device comprising an integrated circuit.

BACKGROUND OF THE INVENTION

Many integrated circuits contain important data which have to be kept secret, for examples codes which are used for encryption, identification and/or authentication purposes. These integrated circuits (chips) are used, for example, in banking applications, ticketing applications or pay TV applications.

Chips which are used in these fields have to be security-certified. Basically, a security certification of this kind proves that the integrated circuit meets a certain security standard. In order to meet a security standard it is usually required that the integrated circuit is sufficiently resistant against tampering. In other words, the integrated circuit must be resistant against all kinds of attacks which aim at retrieval of codes or uncontrolled change of functionality of said integrated circuit.

One important form of attack consists of reverse engineering of the integrated circuit. Another possible attack is to modify the integrated circuit in such a way that certain security measures, for example electrical shields, are circumvented. This kind of attacks typically requires physical or chemical modification of the chip, for example the removal of passivation layers. Unfortunately, such attacks typically go unnoticed because conventional integrated circuits are not capable of detecting removal of a passivation layer autonomously.

SUMMARY OF THE INVENTION

It is an object of the invention to improve the tamper resistance of an integrated circuit by enabling said integrated circuit to detect attacks autonomously using relatively simple on-chip electrical measurements. This object is achieved by an integrated circuit as defined in claim 1 and a corresponding method for manufacturing an integrated circuit as defined in claim 7.

According to an aspect of the invention an integrated circuit is conceived which comprises a physical unclonable function which is at least partially implemented in a passivation layer of said integrated circuit.

According to an exemplary embodiment of the integrated circuit, the physical unclonable function is implemented by randomly distributed conducting particles in said passivation layer.

According to a further exemplary embodiment of the integrated circuit, the randomly distributed conducting particles comprise aluminum.

According to a further exemplary embodiment of the integrated circuit, the integrated circuit further comprises a detector which is arranged to evaluate the physical unclonable function by distinguishing between shorted and open connections between said randomly distributed conducting particles and to produce a corresponding evaluation result.

According to a further exemplary embodiment of the integrated circuit, the integrated circuit is arranged to compare said evaluation result with a reference value.

According to a further exemplary embodiment of the integrated circuit, the reference value is stored in a memory of said integrated circuit.

According to a further aspect of the invention, a method for manufacturing an integrated circuit is conceived which comprises implementing a physical unclonable function at least partially in a passivation layer of said integrated circuit.

According to a further exemplary embodiment of the method, the physical unclonable function is implemented by randomly distributing conducting particles in said passivation layer.

According to a further exemplary embodiment of the method, the randomly distributed conducting particles comprise aluminum.

According to a further exemplary embodiment of the method, said randomly distributed conducting particles are deposited substantially above a detector for evaluating the physical unclonable function.

According to a further aspect of the invention, an electronic device is conceived which comprises an integrated circuit of the kind set forth.

According to a further exemplary embodiment of the method, the electronic device is one of an electronic device for banking applications, an electronic device for ticketing applications and an electronic device for pay television applications.

BRIEF DESCRIPTION OF THE DRAWINGS

The invention will be described in more detail with reference to the appended drawings, in which.

DESCRIPTION OF EMBODIMENTS

Figure 1:
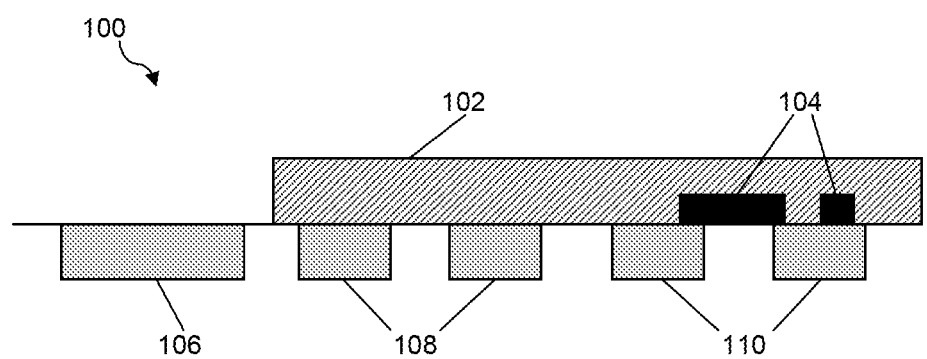
FIG. 1 shows a portion of an integrated circuit comprising a physical unclonable function in accordance with an exemplary embodiment of the invention.

FIG. 1 shows a portion of an integrated circuit 100 comprising a physical unclonable function in accordance with an exemplary embodiment of the invention.

The integrated circuit 100 (also referred to as "chip") comprises a pad 106 for external connections such as supply voltage connections and input/output signal connections. Furthermore, the integrated circuit 100 comprises internal connections 108 for carrying active signals within the integrated circuit 100. In addition, the integrated circuit 100 comprises a physical unclonable function (PUF) detector 110 which contains connections for making contact with randomly distributed conducting particles 104 in the passivation layer 102 of the integrated circuit 100. According to this exemplary embodiment, the randomly distributed conducting particles 104 implement the PUF. The PUF detector 110 is arranged to distinguish between shorted and open connections between said randomly distributed conducting particles 104. In this way the PUF detector 110 evaluates the PUF. All elements except the pad 106 for the external connections are covered by the passivation layer 102.

In general, undesirable modifications of an integrated circuit 100 may be detected by, for example, measuring the resistance or capacity of parts of the circuit 100. Some modifications might be reversible: if, for instance, the removal of the passivation layer 102 of a chip 100 cannot be detected by the chip 100, a possible attack would be to remove the passivation layer 102, modify the circuit 100 and add a new passivation layer 102. According to an aspect of the invention a PUF is implemented in the passivation layer 102 of the chip. The PUF introduces a factor which is random from chip to chip, but as stable as possible for a single chip.

According to an exemplary embodiment of the invention, the passivation layer 102 contains an inhomogeneous characteristic, i.e. a plurality of randomly distributed conducting particles 104, which can be evaluated by the chip 100 autonomously, i.e. by a PUF detector 110 which also forms part of the chip 100. During production of the chip 100, a reference value representing the expected evaluation result of the PUF may be stored in the chip's internal non-volatile memory (not shown). An attempt to remove the passivation layer 102, for example in case of reverse engineering of the chip 100, will irreversibly damage the PUF (i.e. the random structure of conducting particles 104) and the evaluation result of the PUF will permanently deviate from the expected result. Thus, the chip 100 may evaluate the PUF by means of the PUF detector 110 and compare the evaluation result with the reference value in order to determine whether or not the passivation layer 102 has been removed.

If the passivation layer 102 is removed and/or replaced, the change can be detected by the chip 100 autonomously in a relatively easy way. PUFs implemented by poorly matching devices like small diodes or transistors have the disadvantage, that they usually do not notice a modification of the top or bottom surface of the chip, while a protection of these parts against unnoticed modification would raise the security hardness of the chip. PUFs using the properties of the surface, such as optical or electrical properties, are difficult to implement. A PUF implemented by randomly distributed conducting particles 104 in the passivation layer 102 of the chip 100 protects the surface of the chip 100 in combination with a relatively easy detection scheme.

Figure 2:
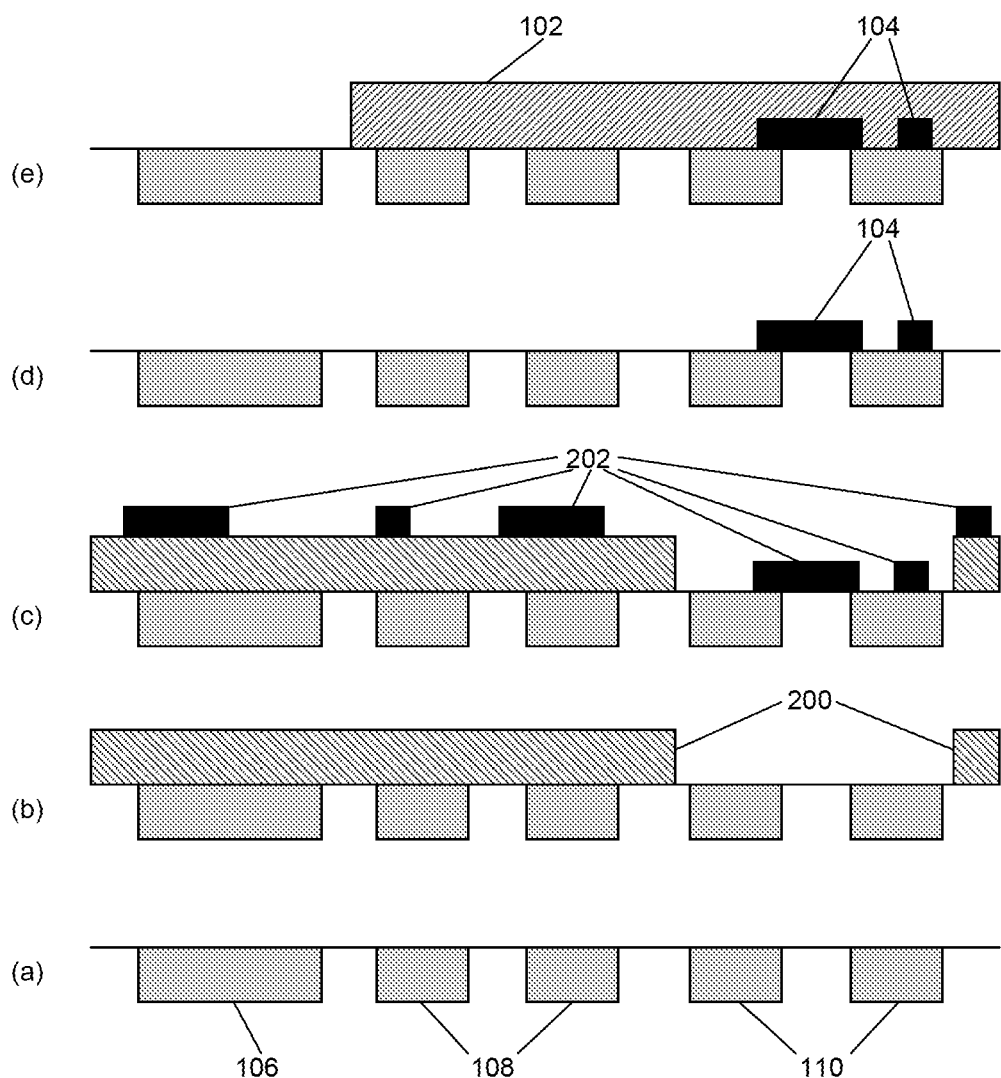
FIG. 2 shows a method of producing a portion of an integrated circuit comprising a physical unclonable function in accordance with an exemplary embodiment of the invention.

FIG. 2 shows a method of producing a portion of an integrated circuit comprising a physical unclonable function in accordance with an exemplary embodiment of the invention.

In step (a) a basic structure is provided which comprises a pad 106 for external connections, internal connections 108 and PUF detector connections 110. For example, these elements may form a regular aluminum pattern. In step (b) this basic structure is covered with a photoresist layer 200, which is part of a normal photolithographic process. However, the PUF detector connections 110 are not covered by the photoresist layer 200. Subsequently, in step (c) conducting particles are randomly distributed over the entire surface of the intermediate product. For example, these particles form a random aluminum pattern 202 on the entire surface. The random aluminum pattern 202 may for example be created by stopping the deposition of aluminum at an arbitrary moment in time. In step (d) the photoresist layer 200 is removed such that only some randomly distributed conducting particles 104 remain on the surface of the basic structure. In particular, only those particles which are substantially above the PUF detector connections 110 remain on the surface. Finally, in step (e) the passivation layer 102 is deposited on all elements except the pad 106 for the external connections.

The above-mentioned embodiments illustrate rather than limit the invention, and the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

LIST OF REFERENCE SIGNS 100 integrated circuit
102 passivation layer
104 random aluminum pattern
106 pad for external connections
108 internal connections
110 PUF detector
200 photoresist layer
202 random aluminum pattern

The invention claimed is:

1. A method for manufacturing an integrated circuit comprising implementing a physical unclonable function at least partially in a passivation layer of said integrated circuit comprising:
    (a) providing a basic structure which comprises a pad for external connections, internal connections and PUF detector connections;
    (b) covering the basic structure, except the PUF detector connections, with photoresist layer;
    (c) randomly distributing conducting particles over the entire resulting surface;
    (d) removing the photoresist layer such that only the particles which are substantially above the PUF detector connections remain on the surface;
    (e) depositing the passivation layer on all elements except the pad for the external connections.

2. The method for manufacturing an integrated circuit as claimed in claim 1, wherein the randomly distributed conducting particles comprise aluminum.

3. An integrated circuit comprising a portion produced by the method as claimed in claim 1.

4. The integrated circuit as claimed in claim 3, the integrated circuit being arranged to evaluate the physical unclonable function by determining which of the PUF detector connections are shorted by the particles, and wherein the integrated circuit is further arranged to produce a corresponding evaluation result.

5. The integrated circuit as claimed in claim 4, wherein the integrated circuit is arranged to compare said evaluation result with a reference value.

6. The integrated circuit as claimed in claim 5, wherein the reference value is stored in a memory of said integrated circuit.

* * * * *